United States Patent [19]

Squire

[11] Patent Number: 4,530,569

[45] Date of Patent: Jul. 23, 1985

[54] OPTICAL FIBERS COMPRISING CORES CLAD WITH AMORPHOUS COPOLYMERS OF PERFLUORO-2,2-DIMETHYL-1,3-DIOXOLE

[75] Inventor: Edward N. Squire, Glen Mills, Pa.

[73] Assignee: E. I. Du Pont de Nemours and Company, Wilmington, Del.

[21] Appl. No.: 591,486

[22] Filed: Mar. 20, 1984

Related U.S. Application Data

[63] Continuation-in-part of Ser. No. 294,789, Aug. 20, 1981, abandoned.

[51] Int. Cl.³ .................. C08F 214/26; G02B 5/14
[52] U.S. Cl. .................. 350/96.34; 526/243; 526/245; 526/247
[58] Field of Search ............ 350/96.1, 96.29, 96.30, 350/96.33, 96.34; 526/243, 245, 247

[56] References Cited

U.S. PATENT DOCUMENTS

| | | | |
|---|---|---|---|
| 2,468,664 | 4/1949 | Hanford et al. | 526/228 |
| 3,641,332 | 2/1972 | Reick et al. | 350/96.1 |
| 3,855,897 | 12/1974 | Takahashi et al. | 350/96.29 |
| 3,920,980 | 11/1975 | Nath | 350/96.1 |
| 3,969,285 | 7/1976 | Grot | 526/243 |
| 3,978,030 | 8/1976 | Resnick | 526/247 |
| 3,993,834 | 11/1976 | Chimura et al. | 350/96.34 |
| 4,138,194 | 2/1979 | Beasley et al. | 350/96.3 |
| 4,298,245 | 11/1981 | Aulich et al. | 350/96.3 |

*Primary Examiner*—Harry Wong, Jr.
*Attorney, Agent, or Firm*—P.R. Steyermark

[57] ABSTRACT

Amorphous copolymers of perfluoro-2,2-dimethyl-1,3-dioxole with tetrafluoroethylene and, optionally, with another ethylenically unsaturated monomer, have high glass transition temperatures, e.g., 85° C. or higher, low indices of refraction, and good physical properties which make them suitable for cladding optical fibers.

4 Claims, 2 Drawing Figures

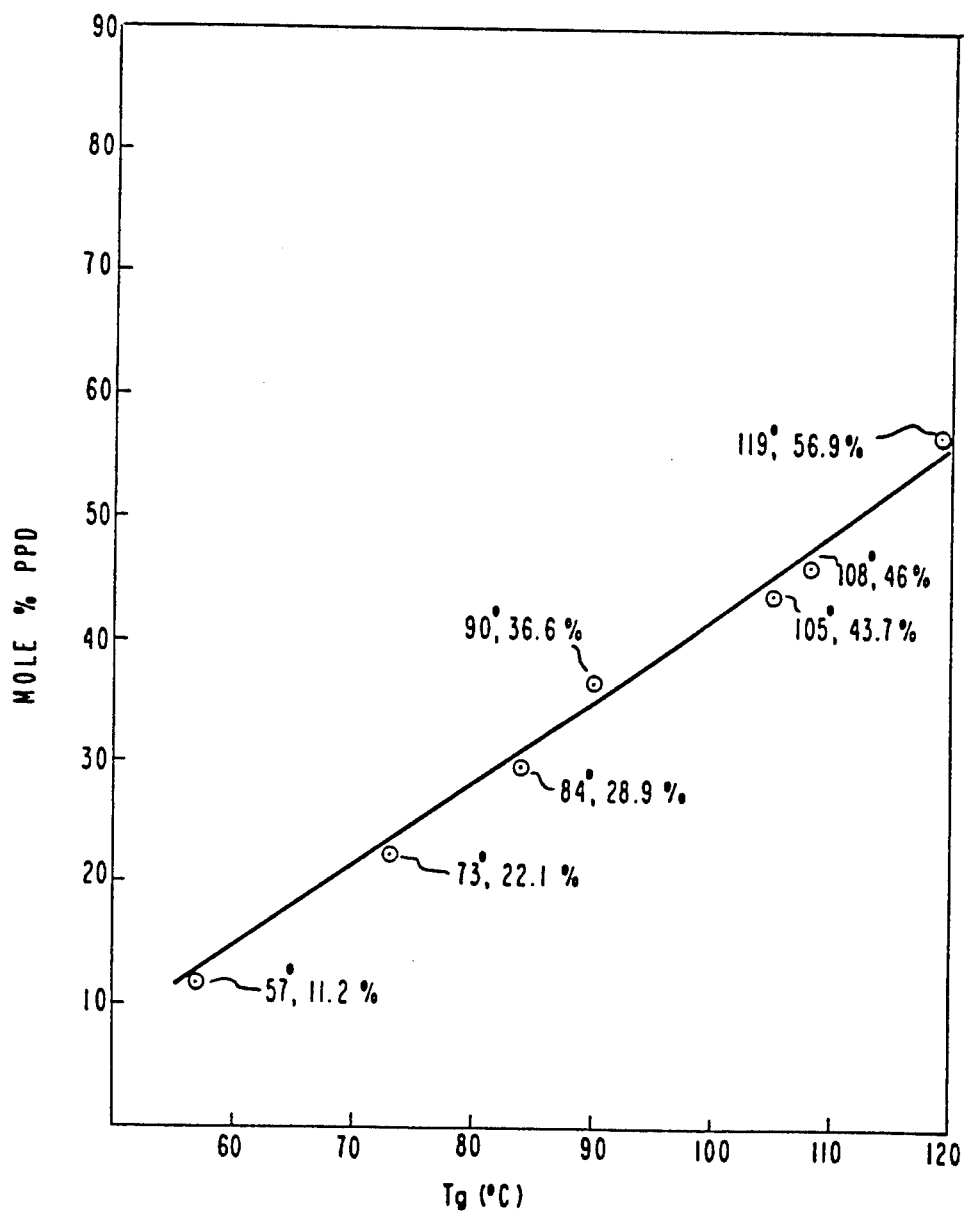
F I G. 1

OPTICAL FIBERS COMPRISING CORES CLAD WITH AMORPHOUS COPOLYMERS OF PERFLUORO-2,2-DIMETHYL-1,3-DIOXOLE

CROSS-REFERENCE TO RELATED APPLICATION

This is a continuation-in-part of my copending application Ser. No. 294,789, filed Aug. 20, 1981, and now abandoned.

BACKGROUND OF THE INVENTION

This invention relates to certain amorphous perfluoropolymers which are particularly suitable as cladding materials in optical fiber constructions.

Various fluoropolymers have been proposed from time to time for this purpose, mainly because of their good performance under a variety of temperature and atmospheric conditions and resistance to many chemicals. A good polymeric cladding material for optical fibers should be completely amorphous because crystallites present in polymers would cause light scattering. Further, it should have a high glass transition temperature, Tg, especially if intended for use at high temperatures because above its Tg it would lose some of its desirable physical properties and in particular it would be unable to maintain good bonding to the fiber core. A desirable Tg would be above 85° C., preferably above 120° C. Entirely amorphous fluoropolymers having significantly high Tg's have not been heretofore reported.

U.S. Pat. No. 3,978,030 to Resnick describes certain polymers of perfluoro-2,2-dimethyl-1,3-dioxole (PDD), which has the following formula:

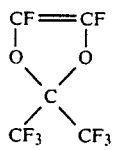

The above patent describes both homopolymers of PDD, which are not further characterized, and a crystalline copolymer with tetrafluoroethylene (TFE), which has a melting point of about 265° C.

SUMMARY OF THE INVENTION

According to this invention, there is now provided a class of amorphous copolymers of perfluoro-2,2-dimethyl-1,3-dioxole with tetrafluoroethylene and, optionally, with at least one other ethylenically unsaturated monomer. There also are provided optical fibers with a copolymer of the above class as the cladding.

BRIEF DESCRIPTION OF THE DRAWINGS

FIG. 1 is a plot of the molar fraction of PDD in the dipolymer versus the Tg of the dipolymer.

DETAILED DESCRIPTION OF THE INVENTION

Figure 2:
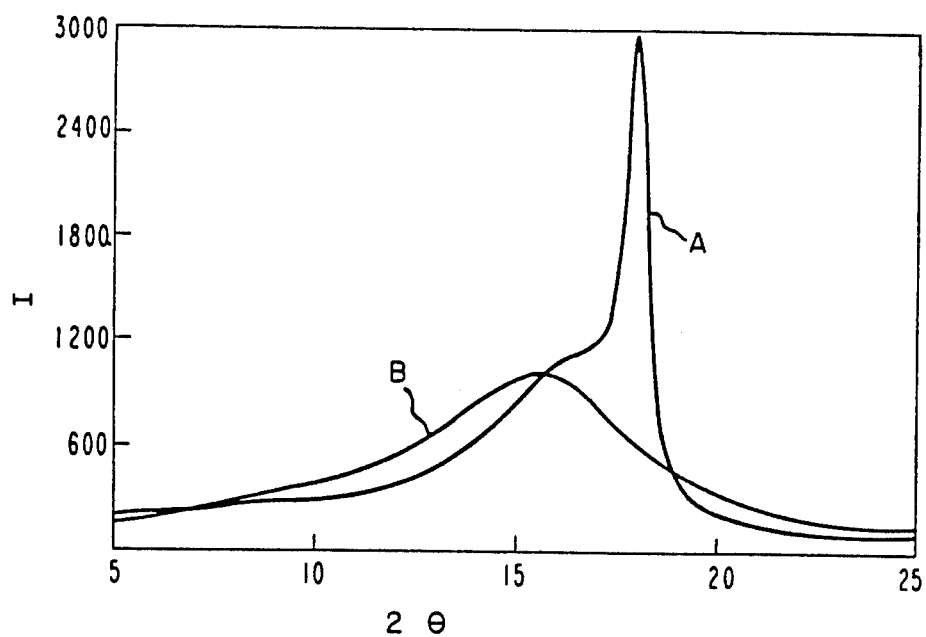
FIG. 2 is a graph representing two wide-angle X-ray powder diffraction scans, respectively, of an amorphous PDD/tetrafluoroethylene copolymer of the present invention and of a prior art crystalline copolymer.

Both principal monomers used in this invention are known to the art. TFE is made in large quantities by E. I. du Pont de Nemours and Company, while PDD is described in the above-mentioned U.S. Pat. No. 3,978,030. Pure PDD boils at about 33° C. at atmospheric pressure. It has now been discovered that these two monomers can be copolymerized in all weight proportions within the range of 1–99 percent TFE.

This discovery is very surprising because no other perfluoro monomer is known to copolymerize with TFE in all proportions except perfluoro-2-methylene-4-methyl-1,3-dioxolane, which is a completely different type of monomer that has an exo-perfluoromethylene group. PDD, on the other hand, has an endo-double bond. In fact, other perfluoro monomers having internal double bonds copolymerize with TFE with extreme difficulty. Monomers such as perfluoropropyl vinyl ether and hexafluoropropylene copolymerize with TFE with such difficulty that copolymers with TFE containing more than 20 mole % of such monomers are not commercially feasible.

As the amount of PDD in the copolymer increases, the Tg also increases, although not necessarily in a linear fashion. The relationship between the molar fraction of PDD in the dipolymer and the Tg is shown in FIG. 1. It can be seen that a copolymer containing 11.2 mole percent PDD has a Tg of 57° C., and a copolymer containing 56.9 mole percent PDD has a Tg of 119° C. Copolymers having intermediate amounts of PDD also have intermediate Tg's. Tg is determined by differential scanning calorimetry (DSC) according to ASTM method D-3418. It has been found that copolymers of PDD and TFE in which the amount of PDD is less than about 11 mole percent are normally crystalline. Although the exact breakpoint for crystalline character has not been established with certainty, it is believed that copolymers having 7 mole percent or less of PDD are all crystalline. The relative proportions of the comonomers in the copolymer can be determined by fluorine-19 nuclear magnetic resonance spectroscopy (NMR). The proportion of hydrogen-containing monomers can be determined by proton NMR together with 19F NMR. The relative proportions and reactivities of the various monomers in a copolymer correspond more or less to the proportions of the starting monomers in the polymerization reaction.

A homopolymer of PDD appears to be amorphous and has a high Tg. However, PDD is a much more expensive monomer than TFE so that use of PDD homopolymers, rather than of PDD/TFE copolymers, is economically much less attractive. Furthermore, the copolymers are easier to fabricate. The dipolymers have low refractive indices, which is a particularly desirable feature for optical fiber cladding. Furthermore, films of these copolymers are clear and transparent, compared with hazy or translucent films of crystalline polymers. For this reason, the amorphous copolymers of the present invention are suitable for such applications as, for example, windows for chemical reactors, especially for processes using or manufacturing hydrogen fluoride. Amorphous terpolymers can be made by copolymerizing certain ethylenically unsaturated monomers with perfluoro-2,2-dimethyl-1,3-dioxole and tetrafluoroethylene. These include selected olefins, vinyl compounds, and perfluoromonomers. Typical olefins are, for example, ethylene, propylene, 1-butene, isobutylene, trifluoropropene, and trifluoroethylene. Vinyl monomers can be, for example, vinyl fluoride, vinylidene fluoride, and chlorotrifluoroethylene. Perfluoromonomers may be of different chemical types, for example, perfluoropropene, perfluoro(1,3-dioxole), perfluoro(alkyl vinyl ethers), methyl 3-[1-[difluoro[(trifluoroethenyl)oxy]methyl]-1,2,2,2-tetrafluoroethoxy]-2,2,3,3-tetrafluoropropanoate

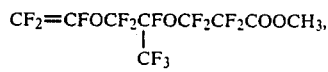

and 2-[1-[difluoro[(trifluoroethenyl)oxy]methyl]-1,2,2,2-tetrafluoroethoxy]-1,1,2,2-tetrafluoroethanesulfonyl fluoride

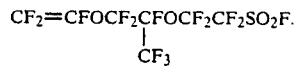

The proportion of PDD in the amorphous terpolymers of this invention should preferably be at least 12 mole percent of the TFE content, while the mole percent content of the third monomer should be the smallest of all three monomers. Outside these limits either an amorphous terpolymer may not be obtained or, if made, its maximum tensile modulus and strength may not be realized.

Copolymerization is carried out in the presence of a free radical generator, preferably at a slightly elevated temperature, for example, 55°–65° C. Well agitated pressure equipment should be used.

This invention is now illustrated by the following examples of certain preferred embodiments thereof, where all parts, proportions, and percentages are by weight, unless otherwise indicated. All Tg's were determined using Du Pont Differential Thermal Analyzer Models 900 or 990. All units other than SI have been converted to SI units.

EXAMPLE 1

A 110 cm³ stainless steel shaker tube was charged with a cold solution of 8.2 g (0.0336 mole) PDD and 0.006 g of perfluoropropionyl peroxide in 120 g of 1,1,2-trichloro-1,2,2-trifluoroethane. The tube was closed and chilled further to about −50° C., then alternately evacuated and quickly flushed with nitrogen three times. The cold, evacuated tube was mounted in a horizontal shaker and charged with 2 g (0.02 mole) of TFE. The tube was agitated and heated at autogenous pressure to 50°–55° C. and maintained in this temperature range for two hours. After cooling and venting the tube, the liquid contents were removed; 1,1,2-trichloro-1,2,2-trifluoroethane was distilled off, and the remaining solid polymer was dried in a vacuum oven at 110° C. for sixteen hours. The Tg of the copolymer was 119° C. The apparent melt viscosity (AMV) was 0.9 kPa.s at 230° C. This value was calculated from the melt flow rate (MFR) determined according to ASTM D2116 at a load of 383.1 g at 230° C.

$$AMV (Pa \cdot s) = \frac{6.4 \times \text{load (g)}}{MFR \text{ (g/10 min)}}$$

NMR analysis of the copolymer showed that it contained 56.9 mole percent PDD and 43.1 mole percent TFE.

EXAMPLE 2

Following the procedure of Example 1, a 400 cm³ stainless steel shaker tube was charged with 270 g of 1,1,2-trichloro-1,2,2-trifluoroethane, 30 g (0.123 mole) of PDD, 0.08 g of bis(4-t-butylcyclohexyl)peroxydicarbonate, and 40 g (0.4 mole) of TFE. The tube was agitated five hours at 55°–65° C. The resulting copolymer, 49.6 g, was isolated as described in Example 1. Its Tg was 73° C.

EXAMPLE 3

Following the procedure of Example 2, a 110 cm³ tube was charged with 120 g of 1,1,2-trichloro-1,2,2-trifluoroethane, 9 g (0.0369 mole) PDD, 0.03 g of bis(4-T-butylcyclohexyl)peroxydicarbonate, and 4 g (0.04 mole) of TFE. Heating 4 hours with agitation at 60° C. produced 10 g of copolymer which had Tg's at 102° and 104° C. Extracted overnight with the polymerization solvent, the product gave three fractions. The least soluble fraction (about 70 percent of the total) had a Tg of 105° C. and an apparent melt viscosity of 1.65 kPa.s. NMR analysis showed that it contained 43.7 mole percent PDD and 56.3 mole percent TFE. The more soluble fractions had Tg's, respectively, at 99° and 101° C.

EXAMPLE 4

Following the procedure of Example 1, a 110 cm³ shaker tube was charged with 100 g of 1,1,2-trichloro-1,2,2-trifluoroethane, 9.8 g (0.0402 mole) of PDD, 6 g (0.06 mole) of TFE and 0.03 g of bis(4-t-butylcyclohexyl)peroxydicarbonate. The agitated tube was heated five hours at 53°–63° C. under autogenous pressure. The resulting copolymer weighed 9.1 g. It was found by DSC to have physical transitions at 74° C., 82° C., 122° C. and 124° C. Soxhlet extraction of the copolymer with 1,1,2-trichloro-1,2,2-trifluoroethane gave three polymeric fractions: the least soluble, Tg=92° C.; the middle solubility fraction, Tg=93° C.; and the most soluble, Tg=70° C.

EXAMPLE 5

Following the general procedure of Example 2, copolymerization of 5 g (0.0205 mole) of PDD, 10 g (0.1 mole) of TFE, and 2 g (0.0714 mole) of ethylene gave 11.3 g of an amorphous terpolymer, which had glass transitions at 70° C., 72° C., 144° C. and 151° C.

When this experiment was repeated using only 1 g of ethylene, 12.7 g of an amorphous terpolymer was obtained, which had glass transitions at 63° C. and 143° C. A film was pressed from this terpolymer at 230° C. Its infrared spectrum was consistent with that of a terpolymer of TFE, PDD, and ethylene. After extraction to remove any trace of shaker tube lubricant, the film had glass transitions at 67° C. and 71° C.

EXAMPLE 6

Following the general procedure of Example 2, copolymerization of 5 g (0.0205 mole) of PDD, 10 g (0.1 mole) of TFE, and 0.5 g (0.00893 mole) of isobutylene gave after 3 hours at 55°–80° C. 3 g of a terpolymer, which had glass transitions at 68° C. and 76° C. A film pressed from this polymeric material gave an infrared spectrum consistent with that of a PDD/TFE/isobutylene terpolymer.

EXAMPLE 7

A terpolymer of PDD, TFE, and propylene was obtained under the general conditions of Example 2 from 4 g (0.0164 mole) of PDD, 10 g (0.1 mole) of TFE, and 1 g (0.0238 mole) of propylene. The terpolymer weighed 0.7 g, was elastomeric and readily soluble in the polymerization solvent. A film cast from that solvent had infrared absorbancies which confirmed the terpolymer composition.

EXAMPLE 8

A terpolymer was prepared according to the general procedure of Example 2 from 4 g (0.0164 mole) of PDD, 10 g (0.1 mole) of TFE, and 1 g (0.00213 mole) of 2-[1-[difluoro[(trifluoroethenyl)oxy]methyl]-1,2,2,2-tetrafluoroethoxy]-1,1,2,2-tetrafluoroethanesulfonyl fluoride. This terpolymer weighed 10.8 g and was shown by NMR analysis to consist of 87.1 mole percent TFE, 12.3 mole percent PDD, and 0.6 mole percent of the sulfonyl fluoride monomer. Its infrared spectrum also was consistent with this composition. The terpolymer had glass transitions at 67° C., 124° C., 152° C. and 175° C.

EXAMPLE 9

A terpolymer was made according to the general procedure of Example 2 from 3 g (0.0123 mole) of PDD, 10 g (0.1 mole) of TFE, and 1 g (0.00237 mole) of methyl 3-[1-[difluoro[(trifluoroethenyl)oxy]methyl]-1,2,2,2-tetrafluoroethoxy]-2,2,3,3-tetrafluoropropanoate. The terpolymer weighed 10.2 g. It was pressed at 250° C. into a film, which had infrared absorbancies consistent with the terpolymer composition. Fluorine-19 NMR analysis gave the respective mole percent amounts of the three monomers as 83.7 TFE, 13.4 PDD, and 2.9 methyl ester monomer. Differential thermal analysis of the terpolymer between 25° and 350° C. showed the absence of a melting point.

EXAMPLE 10

A copolymer of PDD and TFE was made according to the general procedure of Example 1 from 8 g of PDD and 0.5 g of TFE. This copolymer had the expected infrared absorption and showed glass transitions at 167° C., 215° C. and 288° C.

COMPARATIVE EXAMPLE

A copolymer was made from 2 parts of PDD and 10 parts of TFE according to the exact procedure of Example 3 of U.S. Pat. No. 3,978,030 to Resnick. This polymeric product was extracted for 25 hours with 1,1,2-trichloro-1,2,2-trifluoroethane. About 0.2 percent of the product weight was thus removed; the extracted fraction was a grease and appeared to consist of shaker tube lubricant and a small amount of an unknown fluorocarbon. Because this obviously was a low molecular weight material, it was expected that the material would have a Tg well below 200° C., if it had a Tg at all. The extracted product had no Tg between 25° and 200° C. It was different from the amorphous copolymers of this invention. The solid extraction residue was a crystalline, rather than an amorphous polymer. This comparative experiment shows that at monomer ratios employed in Example 3 of U.S. Pat. No. 3,978,030 no amorphous PDD/TFE copolymer is obtained.

FIG. 2 shows wide-angle X-ray powder diffraction scans of the solid extraction residue of the crystalline polymeric product of this example (curve A) and of an amorphous TFE/PDD copolymer having a Tg of 73° C. (curve B). In this figure, intensity, I (counts/sec) is plotted against the diffraction angle, $2\theta$. The presence of crystallinity is shown by the sharp peak in curve A. The absence of a sharp peak in curve B denotes lack of crystallinity.

EXAMPLE 11

An amorphous copolymer containing about 78 mole percent TFE and 22 mole percent PDD was made according to the general technique described in Examples 1-4. This material had a Tg of 72° C. and an apparent melt viscosity (AMV) of 0.34 kPa.s at 230° C., which was determined as explained in Example 1, above.

The copolymer was milled at 200°-230° C. and cut to provide an extrusion powder, then charged into the hopper of the crosshead extruder described in U.S. Pat. No. 4,116,654 to Trehu. The copolymer was extruded via a gear pump onto a "TO-8 Commercial" fused silica core, producing a 1 Km continuous length of 540 μm having a 200 μm core. This was done according to the technique described in Example 1 of the Trehu patent. The front heating zone was at 190° C., the rear heating zone at 143°-145° C., the block temperature 225°-228° C., and the die temperature varied from 230° to 245° C. The copolymer flowed smoothly and evenly without bubbles or apparent degradation, providing an even coating with excellent adhesion to the core. The clad fiber easily passed the standard toughness test. A 64 m length was inspected for bubbles and was entirely free of large bubbles. It had an attenuation of 113 dB/Km.

Evaluation of Films

Films 0.025-0.05 cm thick were pressed at 230°-300° C. from polymer granules at 700-7000 kPa. Three of these polymers were amorphous PDD/TFE copolymers of the present invention (Polymer B is the least soluble fraction of Example 4), while the prior art crystalline copolymer was made according to the teaching of U.S. Pat. No. 3,978,030 to Resnick. The physical properties of these films are reported in the following Table, where it can be seen that both the modulus and the tensile strength of the amorphous copolymers of this invention are significantly improved over those of the crystalline copolymer. The amorphous copolymers are thus stiffer and stronger.

TABLE

Physical Properties of TFE/PDD Copolymers

| | Crystalline Copolymer | Amorphous Copolymer A | B | C |
|---|---|---|---|---|
| Mole % PDD | 5-7 | 22.1 | 36.6 | 56.9 |
| Tg (°C.) | — | 73 | 90 | 119 |
| m.p. (°C.) | 265 | — | — | — |
| Tensile Properties* (23° C., 50% RH) | | | | |
| Modulus (MPa) | 620 | 917 | 1117 | 1234 |
| Stress (MPa) | | | | |
| Yield | 15.9 | 26.2 | — | — |
| Maximum | 20.7 | 27.6 | 27.6 | 30.3 |
| Break | 20.7 | 26.9 | 27.6 | 30.3 |
| Strain (%) | | | | |
| Yield | 5.5 | 3.8 | — | — |
| Break | 125.3 | 58.2 | 4.1 | 4.4 |

*ASTM D-1708

I claim:

1. An optical fiber consisting of a core clad with an amorphous copolymer of perfluoro-2,2-dimethyl-1,3-dioxole with tetrafluoroethylene selected from the class consisting of dipolymers and of terpolymers containing in addition another ethylenically unsaturated monomer;

the proportion of perfluoro-2,2-dimethyl-1,3-dioxole in the dipolymer being at least about 11 mole percent of the dipolymer; and the proportion of perfluoro-2,2-dimethyl-1,3-dioxole in the terpolymer being at least about 12 mole percent of the tetrafluoroethylene content, the mole proportion of the third monomer being the smallest of all three monomers.

2. An optical fiber of claim 1 clad with a dipolymer of perfluoro-2,2-dimethyl-1,3-dioxole with tetrafluoroethylene.

3. An optical fiber of claim 1 in which the core is made of silica.

4. An optical fiber of claim 3 in which the cladding is a dipolymer of perfluoro-2,2-dimethyl-1,3-dioxole with tetrafluoroethylene.

* * * * *